United States Patent [19]

Okada et al.

[11] Patent Number: 4,962,320
[45] Date of Patent: Oct. 9, 1990

[54] INPUT PROTECTION CIRCUIT FOR MOS DEVICE

[75] Inventors: Yoshio Okada, Tokyo; Sadao Imada, Yokohama; Mitsuru Shimizu, Chiba, all of Japan

[73] Assignee: Kabushiki Kaisha Toshiba, Kawasaki, Japan

[21] Appl. No.: 379,279

[22] Filed: Jul. 13, 1989

[30] Foreign Application Priority Data

Jul. 29, 1988 [JP] Japan ................. 63-190251

[51] Int. Cl.$^5$ .......................................... H02H 3/20
[52] U.S. Cl. ...................................... 361/56; 361/91; 361/111; 357/23.13
[58] Field of Search .................. 361/56, 91, 111; 357/23.13

[56] References Cited

U.S. PATENT DOCUMENTS

| | | | |
|---|---|---|---|
| 4,586,104 | 4/1986 | Standler | 361/91 |
| 4,663,584 | 5/1987 | Okada et al. | 307/296.4 X |
| 4,740,715 | 4/1988 | Okada | 307/296.4 |
| 4,745,450 | 5/1988 | Hartranft et al. | 361/56 X |
| 4,807,080 | 2/1989 | Clark | 361/56 |
| 4,819,047 | 4/1989 | Gilfeather et al. | 361/56 |
| 4,849,654 | 7/1989 | Okada | 307/296.4 |

*Primary Examiner*—Derek S. Jennings
*Attorney, Agent, or Firm*—Finnegan, Henderson, Farabow, Garrett and Dunner

[57] ABSTRACT

An input protection circuit for MOS devices includes a first resistor and a first parasitic bipolar transistor connected between an input pad and an input buffer circuit of a MOS device. The input protection circuit for MOS devices further includes a second resistor and a second parasitic bipolar transistor connected at a preceding stage of the input buffer circuit so that the gate oxide film of the input buffer circuit can be protected from being damaged by static charges or a voltage which is accidentally generated, without increasing the pattern size of the first parasitic bipolar transistor.

5 Claims, 1 Drawing Sheet

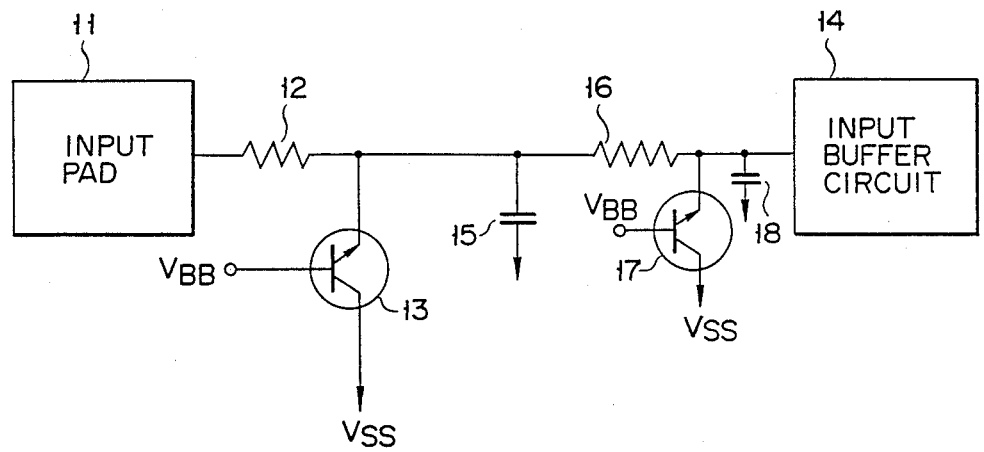
F I G. 1

INPUT PROTECTION CIRCUIT FOR MOS DEVICE

BACKGROUND OF THE INVENTION

1. Field of the Invention

This invention relates to an input protection circuit for MOS devices.

2. Description of the Related Art

In an ordinary MOS device, the gate thereof is isolated from the remaining portion thereof by a gate oxide film ($SiO_2$ film) which forms the dielectric layer between the gate and substrate. Since the gate oxide film is very thin, it may be destroyed in the same manner as other dielectric materials if an excessively high voltage is applied to the gate. As a result, the gate and substrate may be short-circuited and the device will be destroyed permanently. Therefore, special care must be taken so as not to accidentally apply excessive charges to the gate.

FIG. 2 shows an input protection circuit serving as a protection device for the conventional MOS device. Input pad 1 is connected to one end of resistor (R) 2 formed of a diffusion layer or polysilicon layer and the other end of the resistor is connected to the emitter of parasitic bipolar transistor 3. The collector and base of parasitic bipolar transistor 3 are respectively connected to power source terminal Vss (ground potential) and power source terminal VBB (substrate potential). The other end of resistor 2 is connected to the gate in input buffer circuit 4. In FIG. 2, 5 denotes a parasitic capacitance, (C).

The conventional circuit of the above construction may be insufficient in its ability to protect the gate oxide film of the MOS device from being damaged by static charges or a voltage which is accidentally applied to the gate. For example, in FIG. 2, resistor 2 is formed near input pad 1 and the wiring distance between resistor 2 and input buffer circuit 4 is long. Accordingly, the capacitance of parasitic capacitor (C) 5 is large, therefore the resistance of resistor (R) 2 cannot be large from the viewpoint of wave formation (that is, the waveform will become deformed due to RC). As a result, it is necessary to increase the pattern size of parasitic bipolar transistor 3.

As described above, in order to enhance the ability to protect the gate oxide film of the MOS device from being damaged by static charges or a voltage which is accidentally applied to the gate, it is necessary to increase the pattern size of the parasitic bipolar transistor.

SUMMARY OF THE INVENTION

An object of this invention is to provide an input protection circuit for MOS devices in which the gate oxide film can be protected from being damaged by static charges or a voltage which is accidentally applied to the gate, without increasing the pattern size of a clamp element (for example, parasitic bipolar transistor).

The above object can be attained by an input protection circuit for MOS devices which has a first clamp element, connected to an input pad via a first resistor and an input buffer circuit connected between the first clamp element and the first resistor and which further comprises a second resistor connected between the input buffer circuit and a node between the first clamp element and the first resistor; and a second clamp element connected to a node between the second resistor and the input buffer circuit, wherein the gate oxide film of the input buffer circuit can be protected from being damaged by static charges or a voltage which is accidentally applied to the gate, without increasing the pattern size of the first clamp element.

BRIEF DESCRIPTION OF THE DRAWINGS

FIG. 1 is a circuit diagram of an input protection circuit for MOS devices according to one embodiment of this invention.

DETAILED DESCRIPTION OF THE PREFERRED EMBODIMENT

Figure 2:
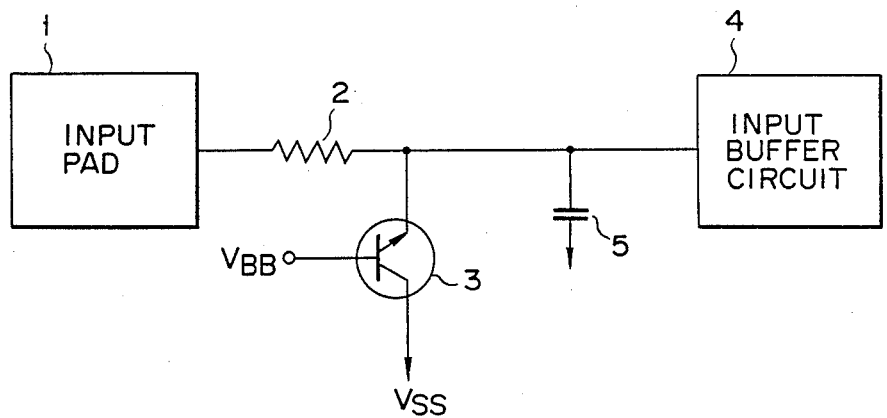
FIG. 2 is a circuit diagram of the conventional input protection circuit for MOS devices.

FIG. 1 shows an input protection circuit for MOS devices according to one embodiment of this invention. Input pad 11 is connected to one end of first resistor (R1) 12 with a resistance of, for example, 100 Ω, formed of a diffusion layer, polysilicon or wiring material, and the other end of first resistor 12 is connected to a clamp element, such as the emitter of first parasitic bipolar transistor 13 formed of an NPN bipolar transistor. The collector and base of first parasitic bipolar transistor 13 are respectively connected to power source terminal Vss (ground potential) and power source terminal VBB (substrate potential). The other end of first resistor 12 is connected to one end of second resistor (R2) 16 with a resistance of 1 KΩ, for example, formed of a diffusion layer, polysilicon or wiring material. The other end of second resistor 16 is connected to a second clamp element, such as the emitter of second parasitic bipolar transistor 17 formed of an NPN bipolar transistor. The collector and base of second parasitic bipolar transistor 17 are respectively connected to power source terminals Vss and VBB. The other end of second resistor 16 is also connected to the gate of input buffer circuit 14 having at least one MOS device. In FIG. 1, 15 denotes a parasitic capacitance (C1) of the wiring having a capacitance of 2 pF, for example, and 18 denotes a parasitic capacitance (C2) of the wiring having a capacitance of 200 fF, for example.

An object of this invention is to enhance the ability to protect the gate oxide film of the input buffer circuit formed of a MOS device from being damaged by a voltage which is accidentally generated and causes stress, without increasing the pattern size of first parasitic bipolar transistor 13.

To this end, in this embodiment, second resistor (R2) 16 with a resistance of 1 KΩ, for example, formed of a diffusion layer, polysilicon or wiring material, and second parasitic bipolar transistor 17 are connected at a stage immediately before input buffer circuit 14. In order to introduce second parasitic bipolar transistor 17 into the circuit, second resistor 16 is used. The capacitance (C2) of parasitic capacitor 18 of the wiring, which is 200 fF, is less than that (C1) of parasitic capacitor 15 of the wiring, which is 2 pF. Thus, the resistance (R2) of second resistor 16 can be increased to 1 KΩ, without causing the deformation of the waveform. Hence, the current flowing in second parasitic bipolar transistor 17 is small, and transistor 17 requires only a small pattern area.

As described above, according to this invention, the second resistor and the second parasitic bipolar transistor, having a small pattern size, are connected at a stage immediately before the input buffer circuit having a MOS device so that the ability to protect the gate oxide film of the input buffer circuit formed of a MOS device from being damaged can be enhanced without increasing the pattern size of the first parasitic bipolar transistor.

What is claimed is:

1. An input protection circuit for a MOS device with an input pad and an input buffer circuit, comprising:
   a first resistor having a first end connected to the input pad, and a second end;
   a first clamp element connected to the second end of the first resistor;
   a first connection line having a first end connected to the second end of the first resistor, the first connection line also having a second end and a first capacitance;
   a second resistor having a first end connected to the second end of the first connection line, the second resistor also having a second end and a resistance greater than the resistance of the first resistor;
   a second clamp element connected to the second end of the second resistor; and
   a second connection line having a first end connected to the second end of the second resistor, the second connection line also having a second end connected to the input buffer circuit and a second capacitance less than the first capacitance of the first connection line.

2. An input protection circuit according to claim 1, wherein said first resistor has a resistance of 100 ohm.

3. An input protection circuit according to claim 1, wherein said first clamp element is a first parasitic bipolar transistor and said second clamp element is a second parasitic bipolar transistor.

4. An input protection circuit according to claim 3, wherein each of said first and second parasitic bipolar transistors formed of formed of an NPN bipolar transistor.

5. An input protection circuit according to claim 4, wherein the emitter of said first parasitic bipolar transistor is connected to a node between said first and second resistors, the base of said first parasitic bipolar transistor is connected to a substrate potential terminal, the collector of said first parasitic bipolar transistor is connected to a ground potential terminal, the emitter of said second bipolar transistor is connected to a node between said second resistor and said input buffer circuit, the base of said second parasitic bipolar transistor is connected to the substrate potential terminal, and the collector of said second parasitic bipolar transistor is connected to the ground potential terminal.

* * * * *